(12) United States Patent
Yoshioka et al.

(10) Patent No.: US 6,358,069 B2
(45) Date of Patent: Mar. 19, 2002

(54) CONNECTING STRUCTURE OF SHIELDED WIRE FOR SHIELD CONNECTOR

(75) Inventors: Nobuaki Yoshioka; Sakai Yagi, both of Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/818,540

(22) Filed: Mar. 28, 2001

(30) Foreign Application Priority Data

Mar. 28, 2000 (JP) ........................................ 2000-089331

(51) Int. Cl.$^7$ ............................................ H01R 13/648
(52) U.S. Cl. ........................................ 439/108; 439/939
(58) Field of Search ........................ 439/98, 675, 939, 439/95, 96, 108, 101, 63, 607

(56) References Cited

U.S. PATENT DOCUMENTS

| | | | | |
|---|---|---|---|---|
| 3,629,538 A | * | 12/1971 | Suzuki | 439/761 |
| 4,012,105 A | * | 3/1977 | Biddle | 439/675 |
| 5,326,280 A | * | 7/1994 | Briones et al. | 439/581 |
| 5,971,811 A | * | 10/1999 | Mori et al. | 439/675 |

FOREIGN PATENT DOCUMENTS

| | | | |
|---|---|---|---|
| JP | 8-64306 | 3/1996 | ......... H01R/13/648 |
| JP | 8-78098 | 3/1996 | ......... H01R/13/648 |
| JP | 10-312856 | 11/1998 | ......... H01R/13/648 |

OTHER PUBLICATIONS

Patent Abstract of Japan 10–312856 Nov. 24, 1998.
Patent Abstract of Japan 8–64306 Mar. 8, 1996.
Patent Abstract of Japan 8–78098 Mar. 22, 1996.

* cited by examiner

*Primary Examiner*—T. C. Patel
(74) *Attorney, Agent, or Firm*—Sughrue Mion, PLLC

(57) ABSTRACT

A terminal is provided on a first face of a conductive plate member. A holder member holds a shielded wire therein. The holder member is provided with a conductive part. The holder member is attached on a second face of the plate member, so that the shielded wire is electrically connected to the terminal. A resilient contact member is interposed between the holder member and the second face of the plate member. The contact member includes a flat face portion which is brought into surface contact with at least one of the conductive part of the holder member and the second face of the plate member.

2 Claims, 4 Drawing Sheets

CONNECTING STRUCTURE OF SHIELDED WIRE FOR SHIELD CONNECTOR

BACKGROUND OF THE INVENTION

The present invention relates to a connecting structure of a shielded wire for a shield connector, and more particularly to connecting structure of the shielded wire of the shield connector which can maintain favorable electromagnetic shielding performance.

In a driving motor mounted on an automobile, for example, many shielded wires have been employed in order to prevent diffusion of noises which are generated from the motor.

As shown in FIG. 5, a shielded wire 50, consists of a core wire 51, an insulating layer 52, a braided shielding part 53, and a sheath 54 which are laminated concentrically. In this shielded wire 50, the core wire 51 is exposed to be press-fitted to a terminal by caulking, and the braided shielding part 53 is folded back so as to cover the sheath 54 and connected to a stepped metal cylinder 68 by caulking.

The shielded wire 50 of this type is fixed to an outer face of a motor case 56 by a shield connector 55, while the braided shielding part 53 is electromagnetically connected to the motor case 56.

The shield connector 55 includes: an insulating cylinder 58 which is adapted to be inserted into a through hole formed in the motor case 56; a rear holder 59 which is fitted to the insulating cylinder 58 after the shielded wire 50 has been inserted into the insulating cylinder 58 thereby to retain a gasket 67 and to prevent vibration of the shielded wire 50; a flange 60 which is provided on an outer face of the insulating cylinder 58 and can be fixed to the outer face of the motor case 56; an O-ring 61 interposed between the motor case 56 and the flange 60; and a metal cylinder 62 for electromagnetic shielding which is inserted into the insulating cylinder 58 coaxially therewith for fixation.

A terminal fitting 63 contained in the insulating cylinder 58 is not axially rotatable about the insulating cylinder 58, and has one end (an upper end portion in FIG. 5) into which the core wire 51 can be inserted and the other end (a lower end portion in FIG. 5) into which a connecting bolt 64 is adapted to be screwed.

The metal cylinder 62 has an axial length extending from an end of the braided shielding part 53 to a contact face 65 of the flange 60, and is provided with contact pieces 66 along the contact face of the flange 60.

In the shield connector 55 of this type, the shielded wire 50 has been in advance passed through the rear holder 59, the gasket 67 and the stepped metal cylinder 68, then, the stepped metal cylinder 68 has been connected to the braided shielding part 53 by caulking, and further, the core wire 51 of the shielded wire 50 has been connected to the one end of the terminal fitting 63 by caulking. Thereafter, the terminal fitting 63 is allowed to be contained in the insulating cylinder 58. The terminal fitting 63 is fixed to the insulating cylinder 58 by a C-ring 63A.

In the next step, by screwing a fixing bolt 69 passed through the flange 60 with the outer face of the motor case 56, the shield connector 55 is fixed to the motor case 56 so that a tip end of the insulating cylinder 58 (a lower end in FIG. 5) may project into the motor case 56.

On this occasion, electromagnetic shielding performance of the shield connector 55 can be obtained through a contact between the contact pieces 66 of the metal cylinder 62 and the outer face of the motor case 56, and in addition, waterproofing property at contact areas between the contact pieces 66 and the motor case 56 can be obtained by the O-ring 61.

In the shield connector 55 having such a structure, a terminal 70 is connected to the terminal fitting 63 by the connecting bolt 64.

However, in the above described shield connector 55, the contact pieces 66 of the metal cylinder 62 is not resiliently in contact with the motor case 56, and therefore, when the flange 60 is thermally shrank or thermally deformed under high temperature condition or by a thermal shock, etc., resistance value will be increased due to an incomplete contact which has occurred at the contact areas between the contact pieces 66 and the motor case 56, and hence, there has been a probability that the electromagnetic performance may be deteriorated.

Especially, in the above described shield connector 55, the O-ring 61 interposed between the motor case 56 and the flange 60 urges the flange 60 to be separated from the motor case 56, and hence, there has been a probability that the deterioration of the electromagnetic performance under the high temperature condition or due to the thermal shock, etc. may be significantly increased.

In order to solve such problems, there is proposed a shield connector in which a conductive contact body having resiliency is interposed between the contact pieces and the motor case (Japanese Patent Publications Nos. 8-64306A and 8-78098A, for example).

According to these related structures, the deterioration of the electromagnetic performance will not be likely to occur, even under the high temperature condition or even though a thermal shock has been applied.

However, in the above described structures, because the conductive contact body is in a form of a spring washer, when the flange has been separated from the motor case under the high temperature condition or due to the thermal shock, etc., the conductive contact body is brought into spot contact or linear contact with either one or both of the motor case and the flange thereby to increase the resistance value. Thus, there has been a fear that the electromagnetic shielding performance may be deteriorated.

SUMMARY OF THE INVENTION

It is therefore an object of the invention to provide a structure of a shielded connector for a shield connector which is capable of maintaining favorable electromagnetic shielding performance even under high temperature conduction or even though a thermal shock has been applied.

In order to attain the above described object, according to the invention, there is provided a structure for connecting a shielded wire and a terminal, comprising:

a conductive plate member, on a first face of which the terminal is provided;

a holder member, for holding the shielded wire therein, the holder member provided with a conductive part, the holder member attached on a second face of the plate member, so that the shielded wire is electrically connected to the terminal; and a resilient contact member, interposed between the holder member and the second face of the plate member, the contact member including a flat face portion which is brought into surface contact with at least one of the conductive part of the holder member and the second face of the plate member.

The conductive contact body may be in a form of a spring washer or a wave washer, and can be of any optional shape, provided that there exist the flat face portion intersecting an axis of the shielded wire substantially perpendicularly.

In this configuration, even though the holder member has been separated from the plate member under the high temperature condition or due to the thermal shock, etc., the contact member can maintain constant contact areas with at least one of the plate member and the holder member. Therefore, the probability that the electromagnetic shielding performance may be deteriorated due to the increase of the resistance value can be reduced.

Preferably, the contact member includes an engagement member engaged with the holder member so as to secure the surface contact part.

In this configuration, the surface contact of the flat face portion can be reliably maintained, whereby favorable electromagnetic shielding performance can be reliably maintained.

DETAILED DESCRIPTION OF THE PREFERRED EMBODIMENTS

Figure 5:
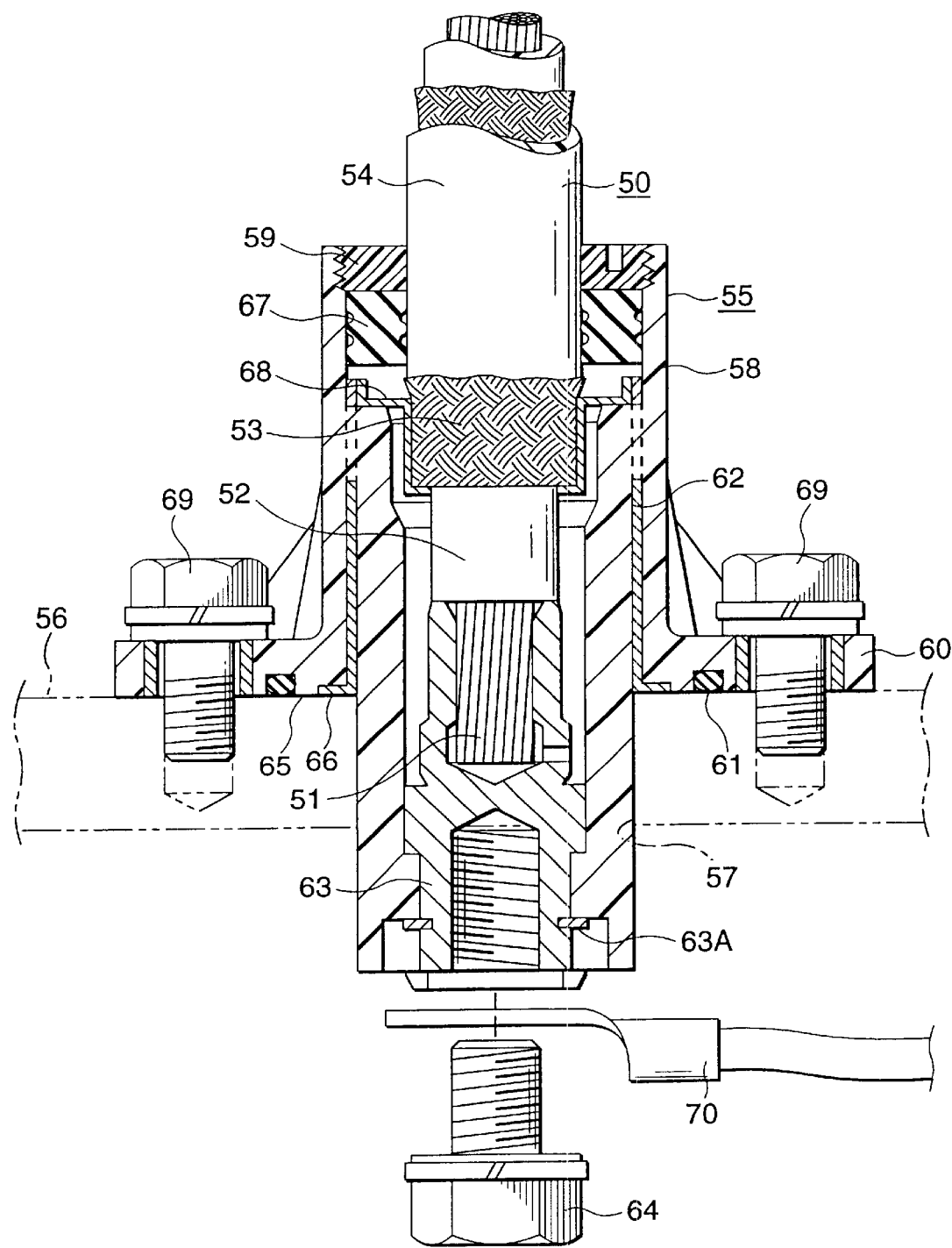
FIG. 5 is a sectional view showing a related connection structure of a shielded wire for a shield connector.

Now, one embodiment according to the invention will be described in detail referring to the accompanying drawings. In the embodiment which will be described below, those components as have already been described in FIG. 5 will be denoted with the same or corresponding reference numerals, and their explanation will be simplified or omitted.

Figure 1:
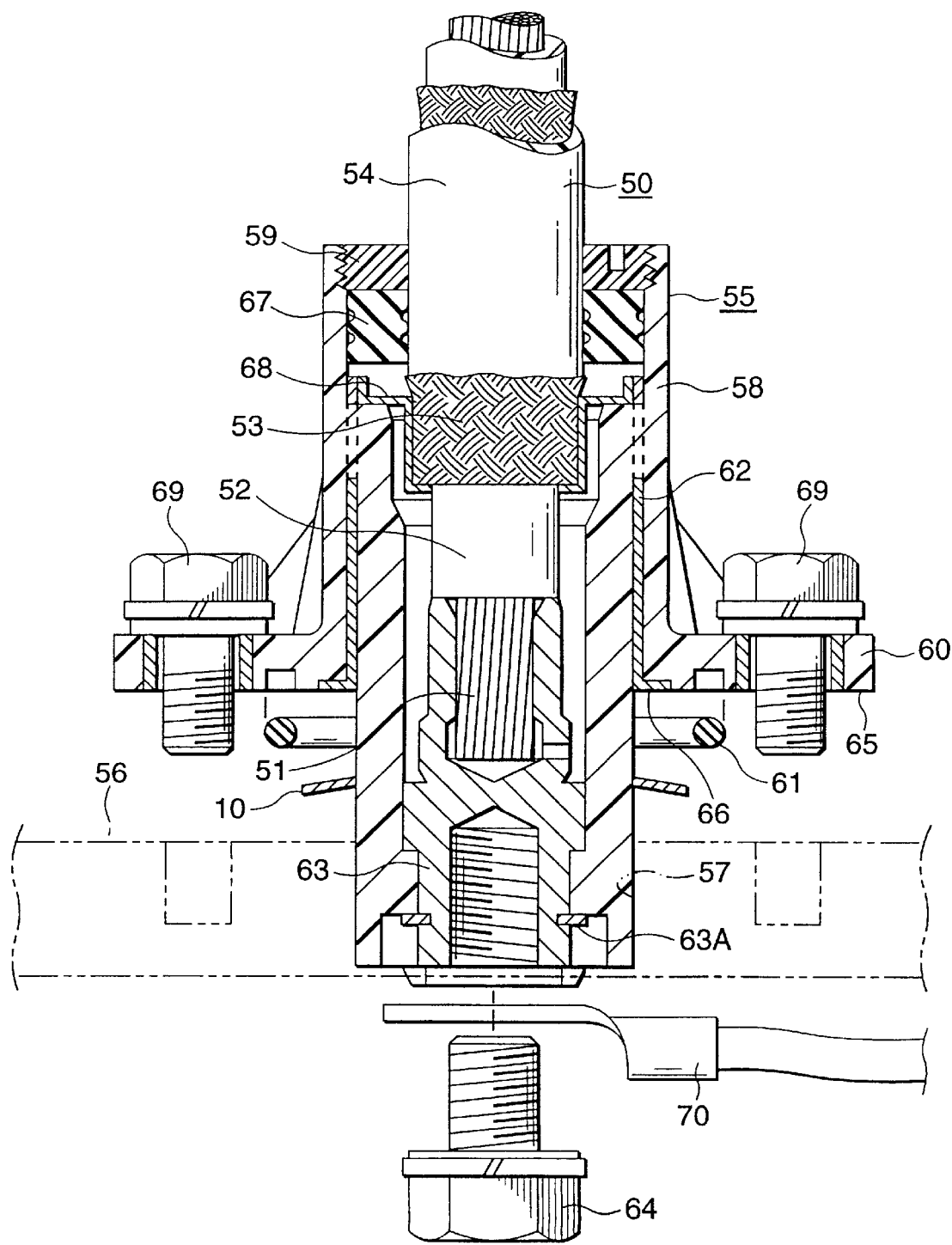
FIG. 1 is a sectional view showing a connection structure of a shielded wire for a shield connector according to one embodiment of the invention.

As shown in FIG. 1, the shield connector 55 includes, in the same manner as the related shield connector, the insulating cylinder 58, the rear holder 59, the flange 60 which can be fixed to the outer face of the motor case 56, the O-ring 61 adapted to be interposed between the motor case 56 and the flange 60, and the metal cylinder 62 which is coaxially inserted into the insulating cylinder 58.

This shield connector 55 earths the braided shielding part 53 of the electric wire 50 and the motor case 56. When the shield connector 55 is connected to the motor case 56, a resilient conductive contact body 10 is interposed between the motor case 56 and the flange 60.

Figure 2:
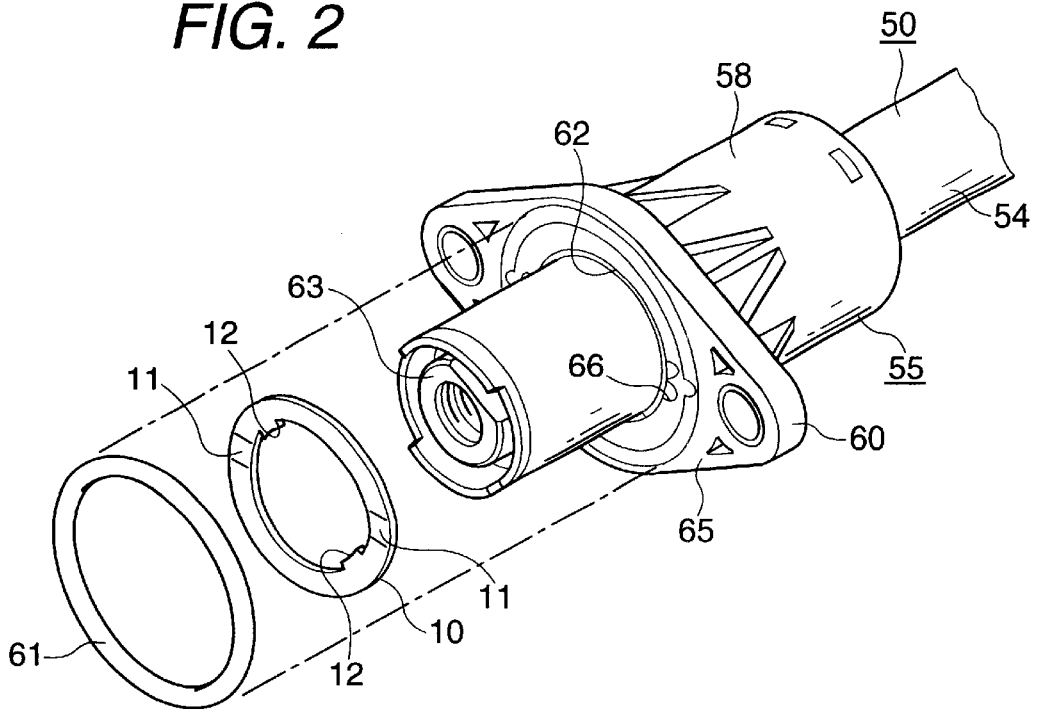
FIG. 2 is a perspective view showing an essential part of FIG. 1.
Figure 3A:
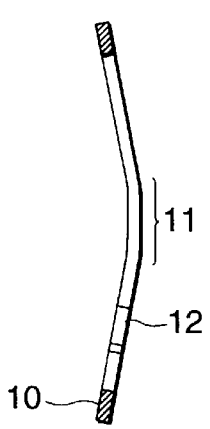
FIGS. 3A and 3B are sectional view and a plan view showing a conductive contact body, respectively.
Figure 3B:
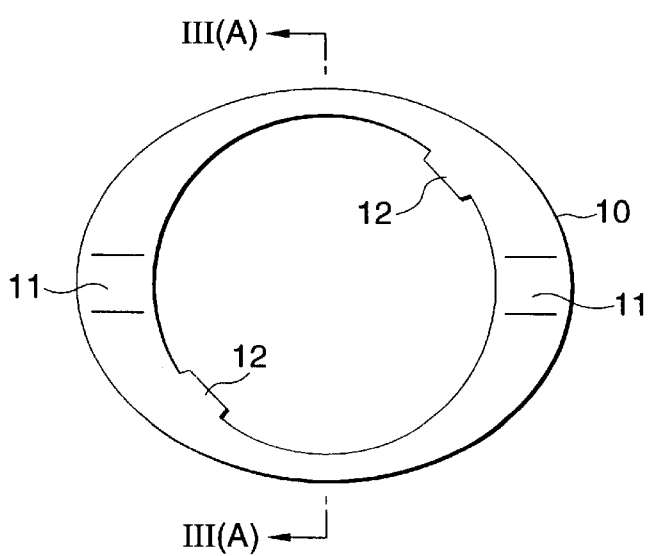

As also shown in FIGS. 2, 3A and 3B, the conductive contact body 10 is substantially in a form of a wave washer, and provided with flat faces 11 which can be in surface contact with the contact pieces 66 of the metal cylinder 62, and a pair of claws 12 on its inner peripheral face.

This contact body 10 is not axially rotatable about the insulating cylinder 58 by locking the claws 12 with a groove (not shown) which is formed around an outer peripheral face of the insulating cylinder 58, and thus, the flat faces 11 can be maintained in surface contact with the contact pieces 66 of the metal cylinder 62.

According to the shield connector 55 having the described structure, because the contact body 10 has the flat faces 11 which can be in surface contact with the contact pieces 66 of the metal cylinder 62, even though the flange 60 has been separated from the motor case 56 under high temperature condition or due to a thermal shock, etc., the contact body 10 can maintain constant contact areas with the contact pieces 66, and hence, the probability that the electromagnetic shielding performance may be deteriorated due to the increase of the resistance value can be reduced.

Especially, the above described conductive contact body 10 is free from a probability of axially rotating about the insulating cylinder 58 because of presence of the claws 12 on the inner peripheral face thereof, and accordingly, the surface contact of the flat faces 11 with respect to the contact pieces 66 can be reliably maintained, whereby favorable electromagnetic shielding performance can be reliably maintained.

Figure 4:
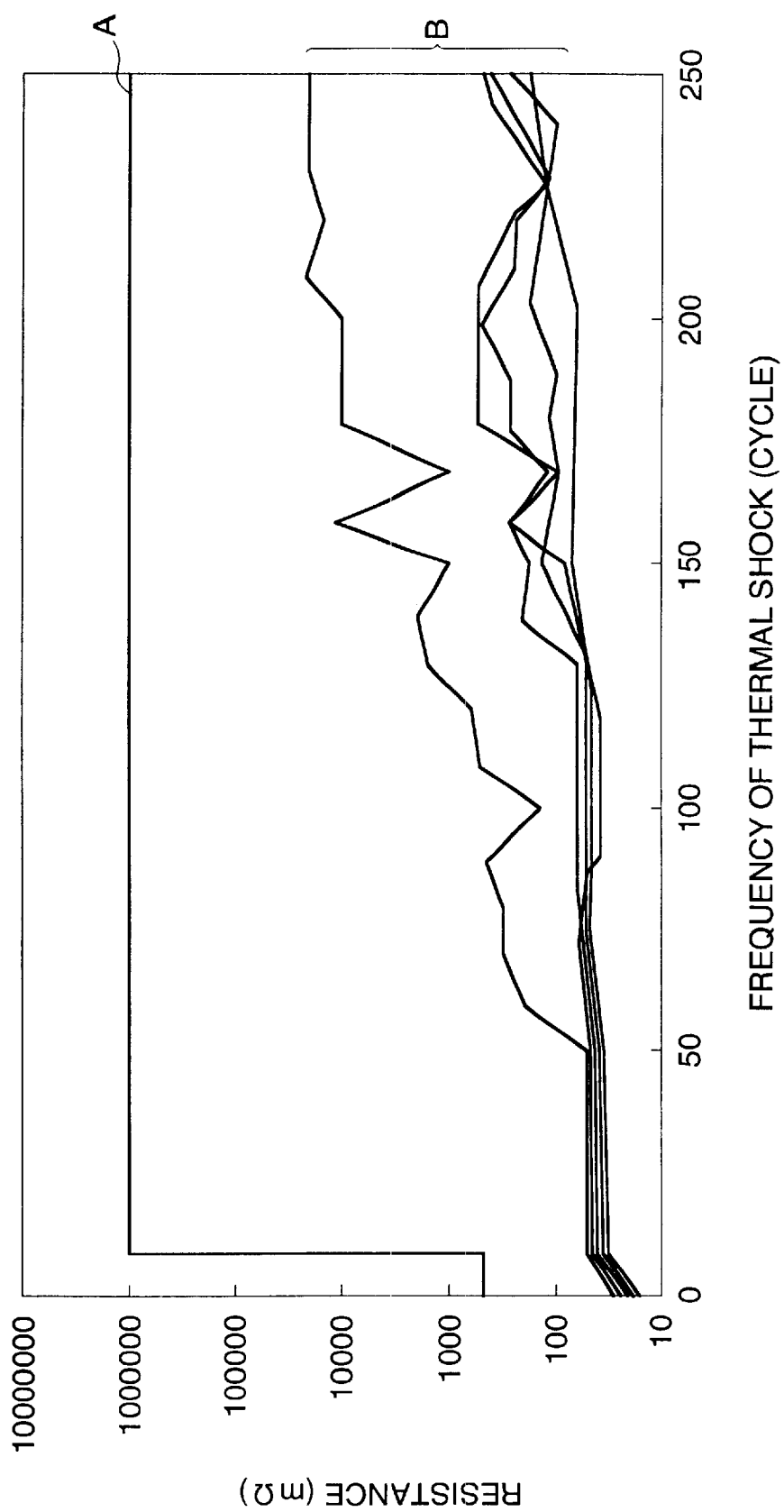
FIG. 4 is a graph showing relations between frequencies of thermal shocks and resistance values.

FIG. 4 shows a graph representing changes of the resistance values between the outer face of the motor case 56 and the metal cylinder 62 relative to an increase of frequency of the thermal shock.

In this graph, A denotes a case wherein the contact body having no flat faces is employed, whereas B denotes a plurality of examples wherein the contact body provided with the flat faces is employed as in the present embodiment.

As seen in the drawing, it is found, in the case A, that when the frequency of the thermal shock exceeds a specific value, the resistance value is abruptly increased. On the other hand, in the cases B, it is found that even though the frequency of the thermal shock is increased, such an abrupt increase of the resistance value is not observed, but relatively stable resistance values can be obtained.

Therefore, it can be confirmed that it is effective to employ the contact body provided with the flat faces which can be in surface contact with the contact pieces of the metal cylinder.

It is to be noted that the invention is not restricted to the above described embodiments, but appropriate changes and modifications can be made. For example, material, shape, dimension, form, number, position, etc. of the fitting plate, the shielded wire, the core wire, the terminal, the insulating cylinder, the fixing member, the flange, the elastic member, the metal cylinder, the contact body, and the flat faces are not limited but optional, provided that the invention can be attained.

What is claimed is:

1. A structure for electrically connecting a shielded wire and a terminal, comprising:

a conductive plate member, wherein the terminal is provided on a first side thereof;

a holder member, for holding the shielded wire therein, the holder member provided with a conductive part, the holder member attached on a second face of the plate member, so that the shielded wire is electrically connected to the terminal; and a resilient contact member, interposed between the conductive part and the second face of the plate member, the contact member including a flat face portion extending in parallel with the second face of the plate member and a resilient portion which is originally inclined with respect to the second face of the plate member.

2. The connecting structure as set forth in claim 1, wherein the contact member includes an engagement member engaged with the holder member so that said engagement member is between the flat portion of the resilient contact member and the conductive part of the holder member.

* * * * *